United States Patent
Boeck

(10) Patent No.: US 6,642,606 B1
(45) Date of Patent: Nov. 4, 2003

(54) METHOD FOR PRODUCING SILICONIZED POLYSILICON CONTACTS IN INTEGRATED SEMICONDUCTOR STRUCTURES

(75) Inventor: Josef Boeck, Munich (DE)

(73) Assignee: Infineon Technologies Aktiengesellschaft, Munich (DE)

( * ) Notice: Subject to any disclaimer, the term of this patent is extended or adjusted under 35 U.S.C. 154(b) by 0 days.

(21) Appl. No.: 10/030,358

(22) PCT Filed: Jun. 28, 2000

(86) PCT No.: PCT/DE00/02098

§ 371 (c)(1),
(2), (4) Date: Mar. 26, 2002

(87) PCT Pub. No.: WO01/06554

PCT Pub. Date: Jan. 25, 2001

(30) Foreign Application Priority Data

Jul. 1, 1999 (DE) .......................... 199 30 420

(51) Int. Cl.[7] ...................... H01L 27/082; H01L 21/331
(52) U.S. Cl. ...................... 257/588; 257/754; 438/330; 438/364; 438/655
(58) Field of Search ................................. 438/329, 330, 438/364, 365, 366, 649, 655; 257/756, 757, 758, 518, 755, 588

(56) References Cited

U.S. PATENT DOCUMENTS

| | | | | |
|---|---|---|---|---|
| 4,740,482 A | | 4/1988 | Hirao | 438/342 |
| 4,812,417 A | * | 3/1989 | Hirao | 438/329 |
| 4,873,200 A | | 10/1989 | Kawakatsu | 438/367 |
| 5,173,437 A | | 12/1992 | Chi | 438/253 |
| 5,268,590 A | | 12/1993 | Pfiester et al. | 257/764 |
| 5,391,906 A | * | 2/1995 | Natsume | 257/739 |
| 5,397,729 A | | 3/1995 | Kayanuma et al. | 438/384 |
| 5,595,935 A | | 1/1997 | Chan et al. | 438/622 |
| 5,654,237 A | * | 8/1997 | Suguro et al. | 438/624 |

FOREIGN PATENT DOCUMENTS

| | | |
|---|---|---|
| EP | 0 772 231 | 5/1997 |
| EP | 0 895 280 | 2/1999 |
| JP | 7-321327 | 8/1995 |

OTHER PUBLICATIONS

Abstract of Japanese Published Application 07–321327, *Patent Abstracts of Japan*, vol. 1996, No. 4, Apr. 30, 1996.

* cited by examiner

*Primary Examiner*—T. N. Quach
(74) *Attorney, Agent, or Firm*—Schiff Hardin & Waite

(57) ABSTRACT

In the manufacture of integrated semiconductor structures, the problem frequently occurs that the resistance of polysilicon structures employed as interconnects must be selectively lowered. In order to reduce the resistance of a polysilicon structure, the structure is often provided with a silicide layer. However, the manufacturing problem occurs when siliconizing only specific polysilicon structures but not siliconizing others, for example those that are to be employed for resistors. A simple method for producing siliconized polysilicon regions in integrated semiconductor structures of a semiconductor blank having at least one structure formed in a first polysilicon layer and a layer of a first dielectric superimposed on the first polysilicon layer by the following steps: applying a second polysilicon layer onto the layer of the first dielectric; applying a layer of a second dielectric onto the second polysilicon layer; forming at least one predetermined structure in the layer of the second dielectric and of the second polysilicon layer; removing the regions of the layer of the first dielectric that are not covered by the at least one predetermined structure, so that the at least one structure, which is to be fashioned in the first polysilicon layer, is at least partly uncovered; and forming a silicide layer on the at least one uncovered structure.

17 Claims, 5 Drawing Sheets

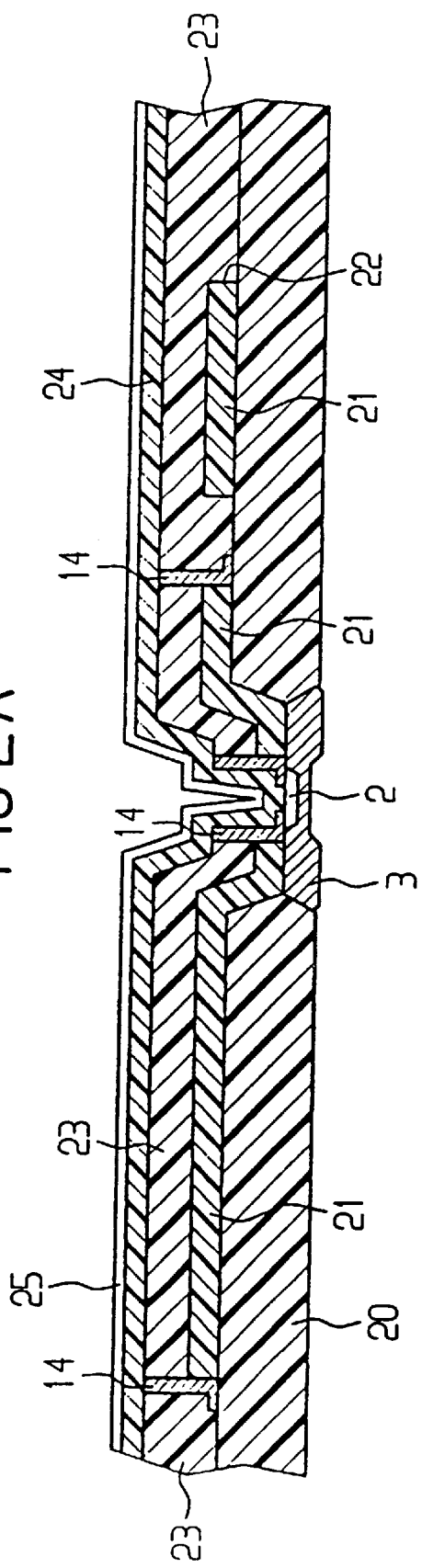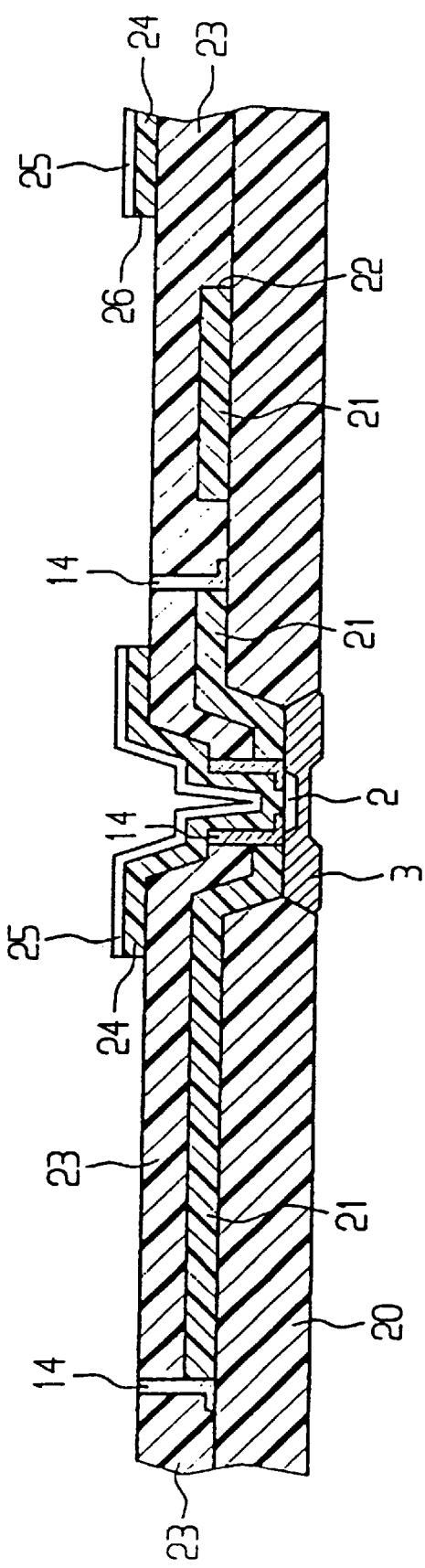

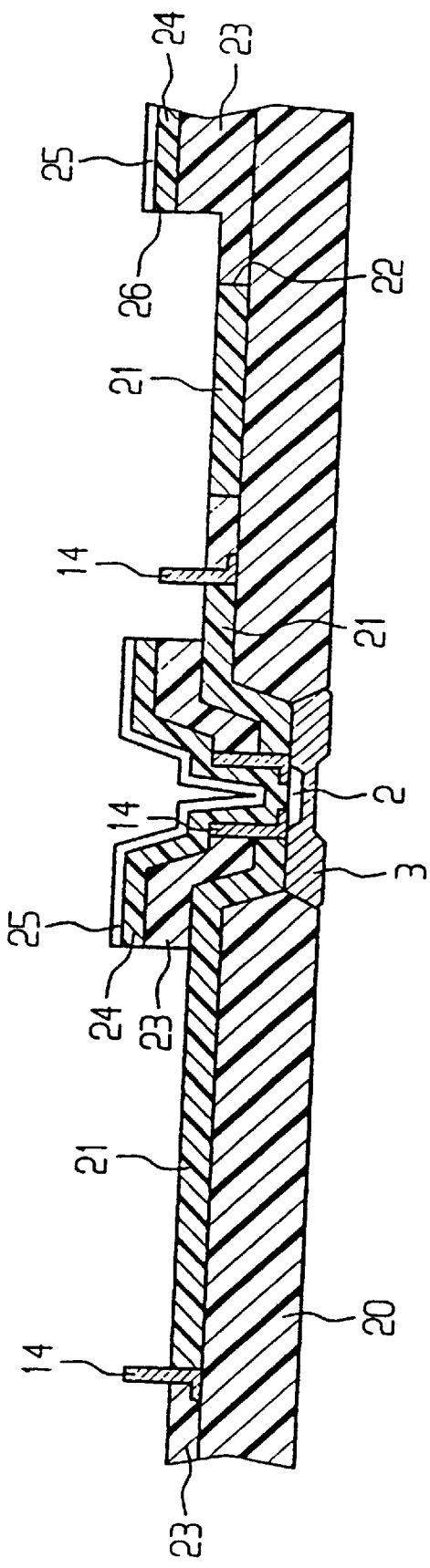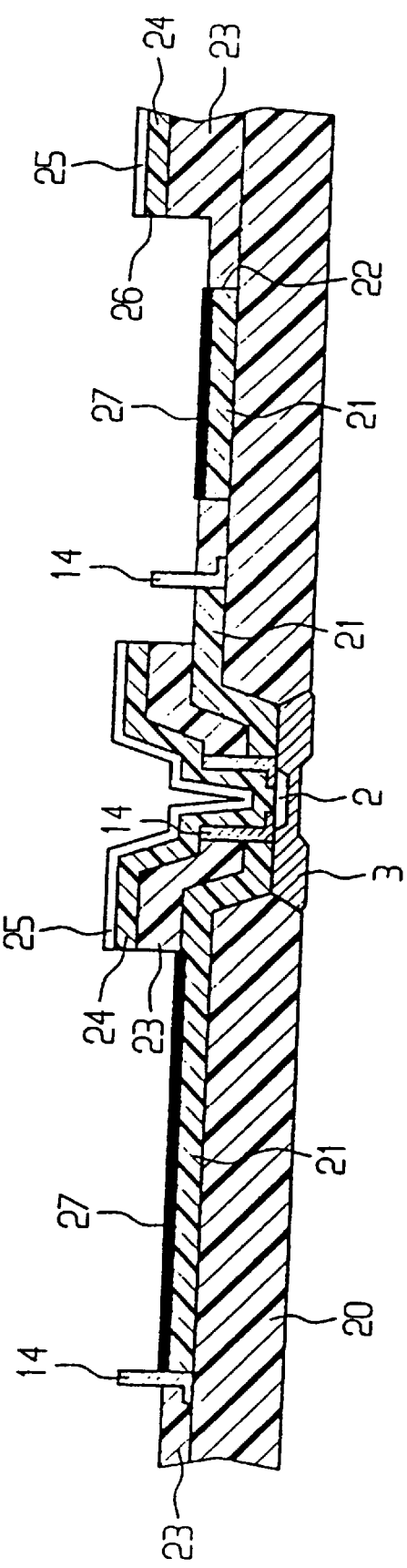

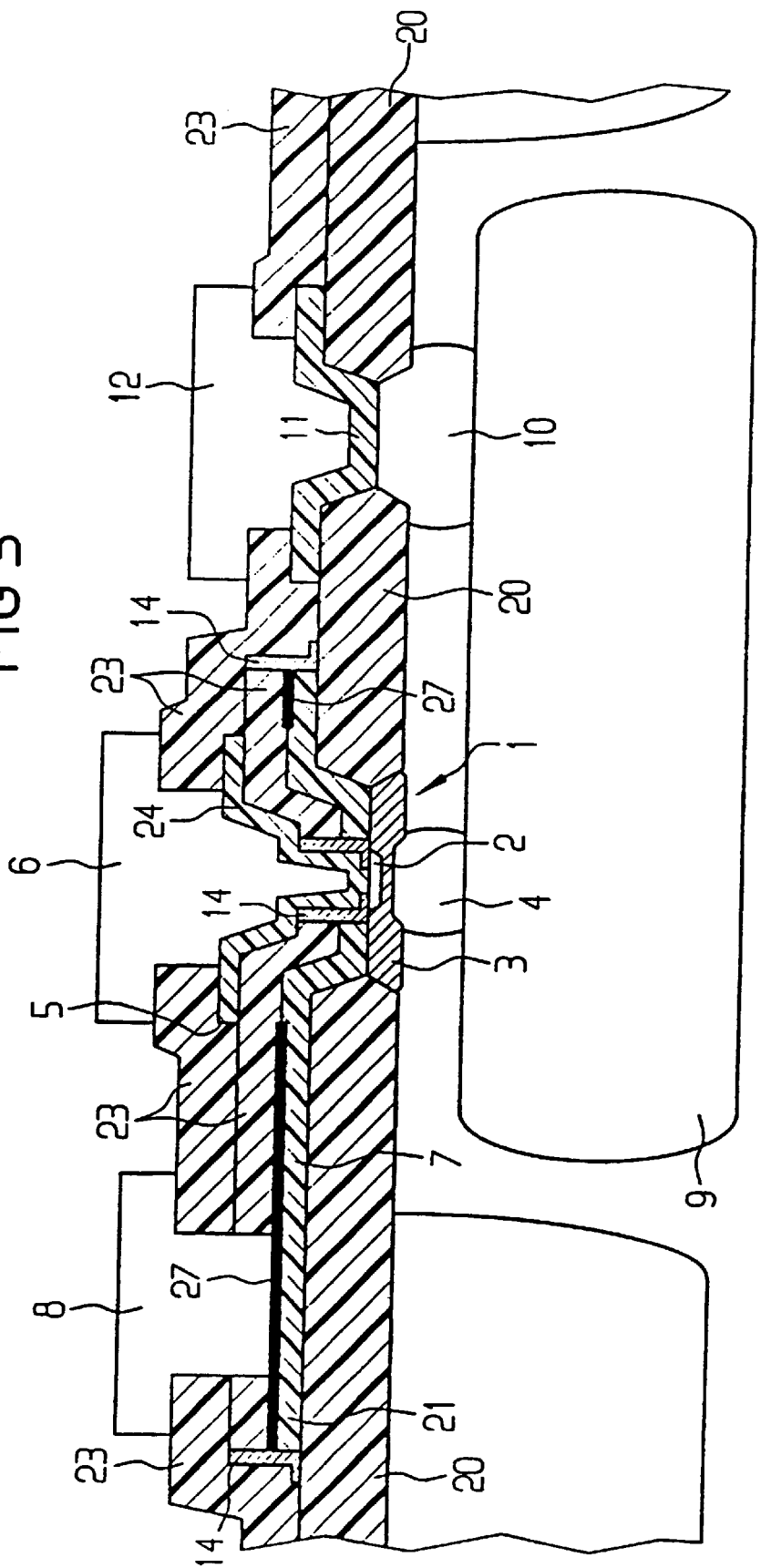

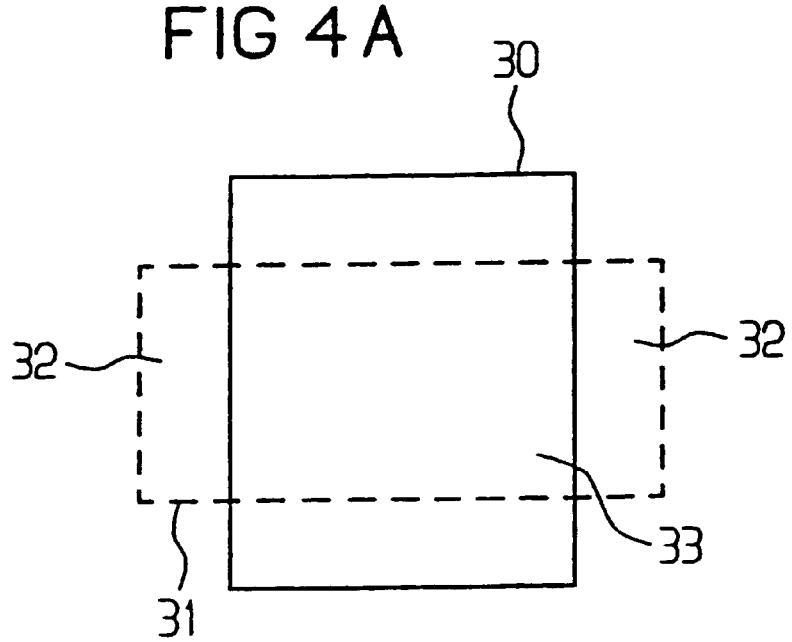
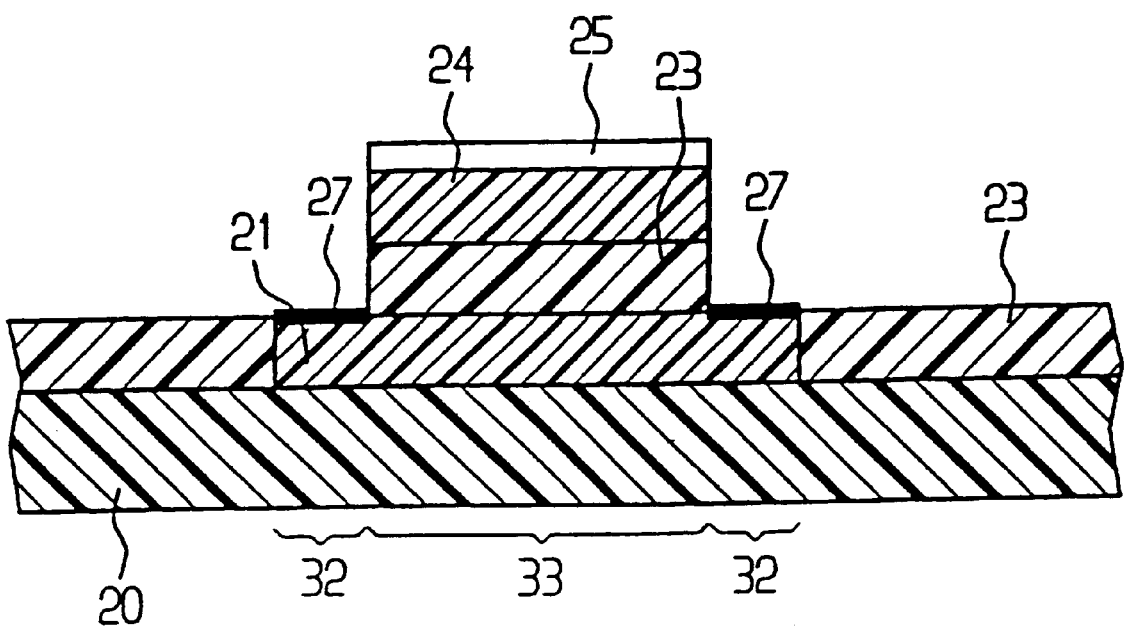

METHOD FOR PRODUCING SILICONIZED POLYSILICON CONTACTS IN INTEGRATED SEMICONDUCTOR STRUCTURES

BACKGROUND OF THE INVENTION

The present invention is directed to a method for producing siliconized polysilicon contacts in integrated semiconductor structures, to the employment of the method for manufacturing a transistor, as well as to a transistor that can be obtained according to the inventive method.

In the manufacture of integrated semiconductor structures, the problem frequently arises that the resistance of polysilicon structures employed as interconnects must be selectively lowered. At the same time, the resistance of other polysilicon structures located in the integrated semiconductor, which is to be manufactured, should remain high since these, for example, are to be employed as resistors within the integrated circuit. In order to reduce the resistance of a polysilicon structure, the structure is often provided with a silicide layer. However, the manufacturing problem of siliconizing only specific polysilicon structures but not siliconizing others, for example those that are to be employed for resistors will occur.

The problem of selective siliconization and solutions known from the prior art shall be discussed below on the basis of a specific example of the employment in an integrated transistor. It is self-evident, however, that the inventive method can also be applied to other fields of employment in semiconductor production and is not intended to be limited to the employment in the manufacture of integrated transistors.

FIG. 1 shows a bipolar transistor in an integrated semiconductor known in the prior art. The actual, active transistor 1 is thereby composed of three juxtaposed, differently doped regions of semiconductors, the emitter region 2, the base region 3 as well as the collector region 4. Dependent on the doping, a distinction is made between pnp-transistors, and npn-transistors, whereby the sequence of the letters identifies the sequence of the doping in the emitter, base and collector region.

Over and above this, a transistor arranged in an integrated circuit also has further auxiliary structures surrounding it, and these structures serve, on the one hand, for isolating potentials and, on the other hand, for the elimination of the currents from the active transistor region 1. The emitter region 2 is connected via an emitter contact 5, which is usually composed of polysilicon, to an emitter interconnect 6 of, for example, aluminum. The base region 3 is connected via a base contact 7 to a base interconnect 8. The collector region 4, finally, is connected via what is referred to as a buried layer 9, which is located under the other structures, and an intermediate layer 10 as well as a collector contact 11 to a collector interconnect 12. Various silicon oxide insulating layers 13 as well as spacer insulators 14 serve the purpose of the electrical separation of the various, electrically conductive structures.

What is referred to as the extrinsic base resistance, which is the resistance between the base 3 and the base interconnect 8, is, in addition to the transit frequency and the base-collector capacitance, the critical transistor parameter in bipolar transistors that defines important characteristic quantities of the transistor such as its maximum oscillation frequency, its gain, its minimum noise after, its gate delay times etc. Thus, valid here, for example, are $$f_{max} \approx \sqrt{\frac{f_T}{8\pi \cdot R_B \cdot C_{BC}}} \quad (1)$$

whereby $f_{max}$: maximum oscillation frequency
$f_T$: transit frequency
$R_B$: base resistance
$C_{BC}$: base-collector capacitance or $$F_{min} \approx 1 + \frac{1}{\beta} + \frac{f}{f_T}\sqrt{\frac{2 \cdot I_C}{V_T}R_B\left(1 + \frac{f_T^2}{\beta \cdot f^2}\right) + \frac{f_T^2}{\beta \cdot f^2}}$$

whereby $F_{min}$: minimum noise factor
$\beta$: gain
$f$: frequency
$f_T$: transit frequency
$I_C$: collector current
$V_T$: thermal voltage
$R_B$: base resistor apply.

In self-aligned silicon bipolar transistors, the base resistance is essentially composed of three parts, these being referred to below as $R_{B,I}$, $R_{B,e}$ and $R_{B,T}$. The inner part $R_{B,I}$ occurs due to the resistance of the base zone in the active transistor 1 under the emitter region 2. The external part $R_{B,e}$ describes the resistance of the polysilicon track 7 that forms the base content. $R_{B,T}$ represents the base resistance that occurs due to a lightly doped zone under the self-aligned emitter base insulation of the spacer insulator 14 at the active transistor. This region is generally referred to as link region in the literature.

Optimizations can be undertaken at all three regions in order to reduce the base resistance. For typical applications, for example, in micro-transistors or ultra high frequency circuits, the transistor is configured in an arrangement with two base contacts instead of one base contact 7 (not shown). The second base contact can, for example, be arranged between the emitter contact and the collector contact. The reduction of the base resistance that is thus achieved, however, is purchased at the expense of an increased space requirement, higher capacitances, a higher power consumption and lower transit frequency.

The advantages of the low base resistance of a transistor having two base contacts and the small structure of a transistor having one base contact can be united when the polysilicon that serves the purpose of base contacting is siliconized, i.e. provided with a silicide layer. The significantly lower film contact of the silicide compared to the polysilicon leads to the fact that the transistor side facing away from the base contact is also connected low-impedance to the base contact via the silicide and, thus, a similar, low base resistance as given a transistor with two base contacts results. Moreover, the resistance inherent in the base contact is reduced.

In addition to being employed for the above-described function, silicide layers can also be utilized as additional wiring level. This enables the optimization of the wiring layout and, thus, of the circuit performance capability.

In a simple, previously known method for siliconization, the siliconization step is introduced immediately after the coating and structuring of the polysilicon. This method, however, has the serious disadvantage of siliconizing not only the desired base terminal regions as well as, potentially, additional interconnects but of siliconizing all uncovered polysilicon regions, i.e. even those wherein a siliconization is unwanted. However, it is precisely the silicon layers that are employed for the base contact as well as the emitter and collector terminal in integrated circuits that are also employed for realizing ohmic load resistors in the circuits. Due to the complete siliconization, the film resistance of the polysilicon layer or layers become so low that resistors (that typically exhibit values from 50 through 1000 ohms) can no longer be meaningfully produced with the assistance of these layers. When a silicide is therefore to be integrated into an integrated circuit, methods are thus necessary that prevent a siliconization in the region of the load resistors. Such methods are referred to in the literature as "silicide blocking". A known method for silicide blocking is implemented with the assistance of photolithography. With the assistance of a resist mask, the dielectric that surrounds the resistor and transistor regions is covered in those regions wherein no silicide formation should occur. With an etching, the dielectric is opened in regions to be siliconized, i.e. removed, and a siliconization is subsequently implemented. The introduction of this additional photolithographic step means a clear increase in the process complexity compared to methods that do not employ a siliconization and thus leads to considerably increased process costs that often make the use of a silicide seem not meaningful despite the improvement of the transistor performance capability.

SUMMARY OF THE INVENTION

The present invention is therefore based on the object of offering a method wherein a selective, i.e. designational siliconization of polysilicon structures is possible without noticeably increased process complexity. This object is inventively achieved by a method for producing siliconized polysilicon contacts in integrated semiconductor structures, for producing a transistor and to a transistor which is produced according to the improved method.

Further advantageous aspects and developments of the invention derive from the patent claims, from the specification and from the attached drawings.

The present invention is based on the basic principle of already covering polysilicon structures with a dielectric before their structuring, this dielectric, in a following step, preventing a dielectric applied earlier from being etched off. A siliconization occurring subsequently takes place only at those locations where the dielectric was etched off.

Accordingly, the present invention is directed to a method for producing siliconized polysilicon regions in integrated semiconductor structures of a semiconductor blank having at least one structure formed in a first polysilicon layer and a layer of a first dielectric superimposed on the first polysilicon layer, said method having the following steps:

applying a second polysilicon layer onto the layer of the first dielectric;

applying a layer of a second dielectric onto the second polysilicon layer;

forming at least one predetermined structure in the layer of the second dielectric and of the second polysilicon layer;

removing the regions of the layer of the first dielectric that are not covered by the at least one predetermined structure, so that the at least one structure fashioned in the first polysilicon layer is at least partly uncovered; and forming a silicide layer on the at least one uncovered structure.

What is thereby to be understood by a semiconductor structure or structure is thereby any interconnected region composed of a uniform material within an integrated semiconductor circuit. Dependent on previously ensuing etch-off or deposition steps, such a structure, accordingly, can also be two-dimensionally or three-dimensionally fashioned but will always have a layer-like structure which occurs in the manufacture of integrated semiconductors.

What is to be understood by a semiconductor blank is an arrangement of structures produced by a semiconductor process that are still in process of being finished, i.e. are not yet fully functional. In the present instance, what are to be particularly understood by this term are those semiconductors being fabricated wherein, following introduction of function elements, a polysilicon layer has been applied and a dielectric layer, which lies above the polysilicon layer, has been applied, so that the polysilicon layer is already structure, i.e. wherein corresponding semiconductor structures have been formed. What is to be understood by a superimposed layer in the sense of the present invention is a layer that has been applied on the semiconductor blank temporarily following another layer superimposed by this layer in the production sequence.

It is self-evident that a structure is formed not only in the first polysilicon layer or, respectively, a structure is formed in the second polysilicon layer; on the contrary a plurality or, respectively, multitude of structures will be present in the two layers, whereby the inventive method also functions when only a single structure in a polysilicon layer is to be siliconized.

The fashioning of the predetermined structure or structures in the layer of the second dielectric and of the second polysilicon layer thereby ensues simultaneously, i.e. that the predetermined structure is imaged both in the layer of the second dielectric as well as in the second polysilicon layer lying therebelow. This predetermined structure or predetermined structures can represent one or more function elements of an integrated circuit. For example, they can be resistors, interconnects or emitter contacts as well of an integrated transistor.

The predetermined structures, however, need not necessarily assume a function within the integrated circuit. On the contrary, they can also or also additionally form a covering that comes to lie over predetermined regions of the first polysilicon layer. What can be achieved in this way is that such covered regions in the first polysilicon layer are not siliconized, even when a function element of the second polysilicon layer accidentally does not come to lie above them. The formation of the at least one predetermined structure or of the predetermined structures preferably comprises the following steps:

Applying a photoresist onto the layer of the second dielectric;

Exposing the photoresist with a mask that images the at least one predetermined structure onto the photoresist;

Developing the photoresist; and

Removing regions of the layer of the second dielectric and of the second polysilicon layer that do not form the at least one predetermined structure.

What is thereby to be understood by a photoresist is a standard photoresist known in the prior art.

Since the regions of the layer of the first dielectric that are not covered must be selectively removed, the two layers of the dielectric must differ in terms of the materials employed in order to enable a selective removal of the layer of the first dielectric. Thus, the removal of the layer of the first dielectric can preferably ensue by etching with an etchant that is selective for the first dielectric. The layer of the first dielectric can, for example, contain silicon dioxide or can be composed of silicon dioxide. This can be etched off with the preferred etchant hydrogen fluoride. The layer of the second dielectric should be etchable by an etchant which is not employed as the etchant for the first layer of dielectric. For example, silicon nitride can be employed for the second dielectric, and silicon nitride will not be etched by hydrogen fluoride.

The silicide layer that is formed can be composed of silicides usually employed in semiconductor technology or, respectively, can at least contain this, for example the preferred titanium silicide, platinum silicide and/or cobalt silicide.

In a preferred embodiment, the at least one uncovered structure in the first polysilicon layer is the base contact of an integrated transistor. In order to maintain a certain resistance in the base contact, it is preferred that it is not the entire surface of the base contact that is siliconized.

The invention is also directed to a transistor that can be obtained by the above-described, inventive method.

Finally, the invention is also directed to the employment of the above-cited method for manufacturing a transistor. Preferably, such a transistor is a bipolar transistor. The method, however, can also be applied to other technologies, for example to CMOS technologies.

In addition to transistors, other siliconized structures can also be manufactured when a CMOS process is utilized.

The invention shall be explained below on the basis of an exemplary embodiment, whereby the attached drawings shall be referenced.

BRIEF DESCRIPTION OF THE DRAWINGS

FIGS. 2A–2D show the steps of the inventive method;

FIG. 3 shows a transistor manufactured according to the inventive method; and

FIGS. 4A and 4B show the possibility of additional masking of specific regions in the first polysilicon layer.

DESCRIPTION OF THE PREFERRED EMBODIMENTS

Figure 1:
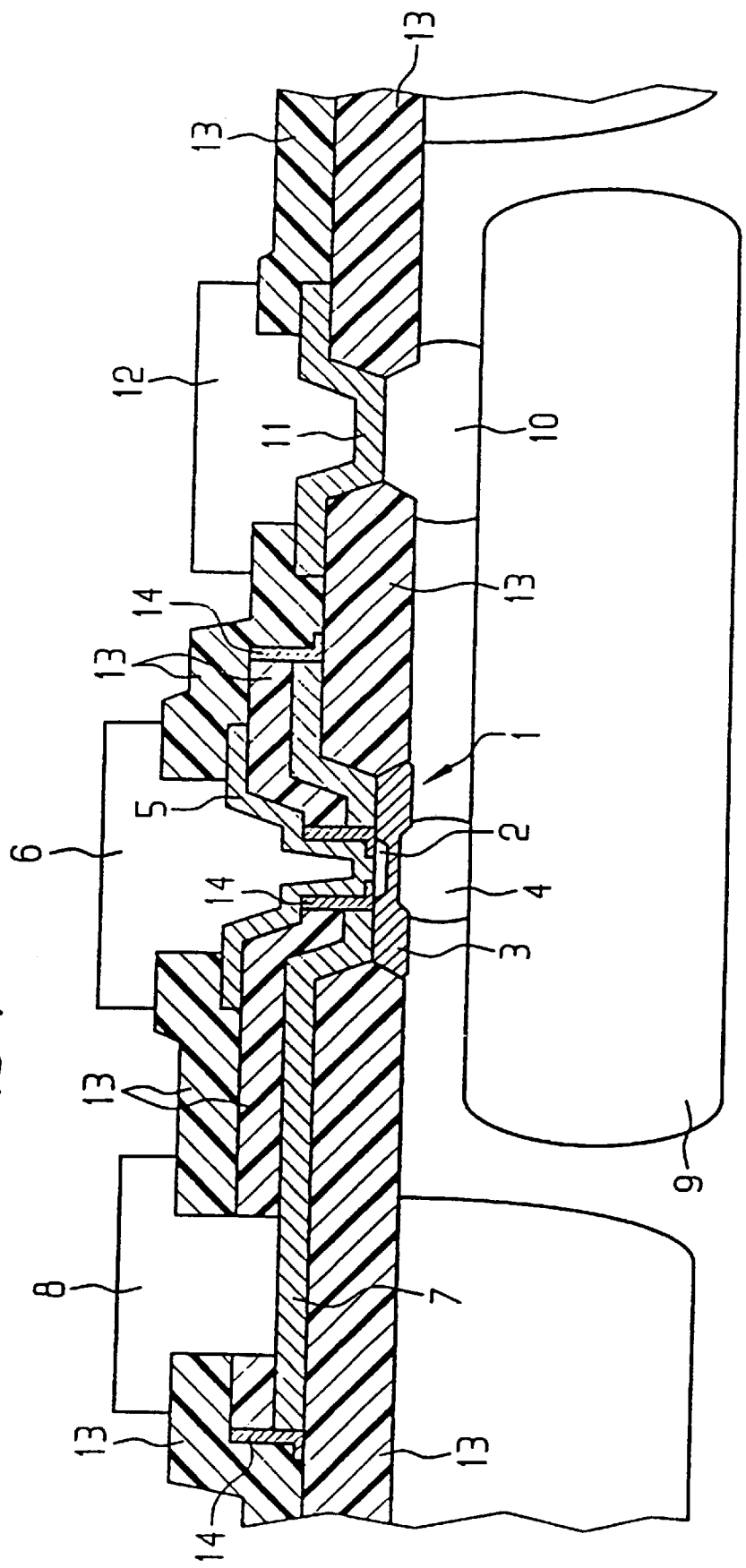
FIG. 1 shows, as described above, a known transistor in an integrated semiconductor.

FIG. 2 shows the progress of the inventive method in various stages. FIG. 2A only shows the upper region of a transistor region in an integrated semiconductor, whereby the collector, the "buried layer" as well as regions that are located on the level of these elements or, respectively, therebelow are not shown. The presentations thus begins the insulation layer 2 onto which the first polysilicon layer 21 has already been applied and this has been structured. For example, a base contact as in FIG. 1 as well as a further resistor 22 are located in the illustrated region of the semiconductor blank. The spacer insulators 14 have already been formed, as has the layer of the first dielectric 23. The second polysilicon layer 24 is deposited thereon. Immediately after the deposition of the second polysilicon layer 24, a thin, additional layer of a second dielectric 25 is deposited, this being composed of a different material than the layer of the first dielectric 23 that surrounds the transistors and resistors. When silicon dioxide is the first dielectric in the standard process, silicon nitride ($Si_3N_4$) can be employed, for example, as the second dielectric. As shown in FIG. 2B, the combined layer of the second polysilicon layer 24 and the layer of the second dielectric 25 is then structured with a mask with which only the second polysilicon layer would otherwise be etched, i.e. without subsequent, intentional siliconization. All regions of the second polysilicon layer 24, however, are now additionally covered with the second dielectric 25. In this method, thus, no modifications of masks that already exist are needed, so that it can be simply introduced into existing productions.

In addition to the emitter contact, a second resistor 26 is also structured in FIG. 2B in this fashion.

With an etchant as shown in FIG. 2C, the layer of the first dielectric 23 is subsequently selectively etched in the regions that are not covered by a layer of the second dielectric 25 (that cannot be etched off by the etchant). The etching uncovers predetermined, non-covered regions of the first polysilicon layer 21.

As shown in FIG. 2D, the silicide formation of the uncovered regions of the first polysilicon layer 21 can now ensue, so that silicide layers 27 can form at the prescribed structures. The structures in the second polysilicon layer are thereby not siliconized, since they are covered by the layer of the second dielectric and are protected by this.

Following the siliconization, the further formatting and the further structuring of the integrated semiconductor can be continued as known in the prior art without further outlay being required. A method for the formation of a silicide layer in integrated semiconductors is thus inventively offered, whereby only one additional deposition of the thin layer of the second dielectric is necessary compared to non-siliconized methods. The added outlay is thus comparatively slight.

The method is thus significantly simpler and less expensive to implement than a silicide blocking with a photolithographic process.

FIG. 3 shows an inventively manufactured bipolar transistor that contains the first polysilicon layer 21 and the silicide layer 27 in integrated fashion. The transistor is also composed of a re-constructed layer of the first dielectric 23 as well as of additional interconnects for discharge of the currents having reference characters 6, 8 and 12 that, for example, can be fabricated of aluminum and essentially correspond to the elements shown in FIG. 1. As to be seen from the illustration, the base contact 7 is particularly provided with a silicide layer 27 in selected regions here. This lowers the base resistance and thus increases the performance capability of the transistor in view of critical transistor parameters such as oscillation frequency, gate delay times, etc.

Given the method outlined above, which refers to the manufacture of a bipolar transistor, no modifications of the mask employed are needed compared to a method wherein no silicide layer 27 is formed. All regions of the first polysilicon layer 21 that are not covered by the second polysilicon layer 24 or, respectively, by the layer of the second dielectric 25 are thus siliconized.

When one also wishes to additionally produce non-siliconated resistors in the first polysilicon layer 21 that are not covered anyway by the second polysilicon layer 24 and the layer of the second dielectric 25, then only a slight design measure is necessary at the mask employed for structuring the second polysilicon layer 24. As shown in FIG. 4A, the mask is additionally drawn, i.e. a covering is generated, in a simple way in the plan region of the resistor, for example, of the resistor 33, so that the second polysilicon layer 24 is not removed there in the structuring.

For manufacture, the first polysilicon layer 21 is first structured with the assistance of the mask 31 provided for this purpose. After deposition of the first dielectric 23 of the second layer of polysilicon 24 as well as of the layer of the second dielectric 25, the second polysilicon layer 24 and the layer of the second dielectric 25 are then structured with the assistance of the mask 30 for the second polysilicon layer. As shown in FIG. 4B, the second polysilicon layer 24 in etching with which the first polysilicon layer 21 is uncovered lies over a resistor region 33 of the first polysilicon layer 21, so that this is not opened by the etching and, thus, also does not receive a silicide layer 27 in the following siliconization.

The contact region 32 of the resistor is not covered by the mask 30, so that, after exposure with the etching, the first polysilicon layer 21 can be uncovered in these regions 32, 32, so that this portion of the layer 21 is siliconized in order to enable a good contact.

Function elements manufactured according to the inventive method, for example transistors or resistors, are fully functional. No negative effects on a transistor characteristic were observed as a consequence of the integration of a silicide layer.

The functionability of the circuit demonstrates, in addition to the transistors, the integrated ohmic resistors are also functional and have thus been effectively protected against the siliconization. As an example of the transistor performance, the minimum delay time amounts to 13.7 ps. For comparison, a minimum gate delay time of 14.8 ps derives given transistors without suicide. The inventively manufactured transistors thus switch faster.

In a previously unknown, simple way, the inventive method enables the fashioning of selectively selected suicide layers on polysilicon structures of integrated semiconductors. Compared to known methods for silicide-selective structuring, it is considerably simple and can be more cost-beneficially implemented. It enables a simple and designational influence of the resistance of polysilicon structures integrated in semiconductors.

I claim:

1. A method for producing siliconized and non-siliconized polysilicon regions in integrated semiconductor structures of a semiconductor blank comprising the steps of providing a semiconductor blank having at least one structure formed in a first polysilicon layer and a layer of a first dielectric material superimposed on the first polysilicon layer; applying a second polysilicon layer onto the layer of the first dielectric material; applying a layer of a second dielectric material onto the second polysilicon layer, the second dielectric material being different from the first dielectric material; forming at least one predetermined structure in the layers of the second dielectric material and of the second polysilicon; removing the regions of the layer of the first dielectric material that are not covered by the at least one predetermined structure by means of etching the first dielectric material selectively relative to the second dielectric material, so that at least one structure fashioned in the first polysilicon layer is partly uncovered to provide at least one uncovered structure and the second polysilicon layer continues to be covered by the second dielectric material; and forming a silicide layer on the at least one uncovered structure, whereby the second polysilicon layer is protected against a siliconization by the second dielectric material.

2. A method according to claim 1, wherein the at least one predetermined structure is a function element of an integrated circuit.

3. A method according to claim 2, wherein the function element is a resistor.

4. A method according to claim 2, wherein the function element is an interconnect.

5. A method according to claim 2, wherein the function element is an emitter contact of an integrated transistor.

6. A method according to claim 1, wherein the at least one predetermined structure forms a covering over prescribed regions of the first polysilicon layer.

7. A method according to claim 1, wherein the step of forming at least one predetermined structure in the layer of the second dielectric material includes the steps of applying a photoresist on the layer of the second dielectric material; exposing the photoresist with a mask that images the at least one predetermined structure onto the photoresist; developing the photoresist and removing regions of the layer of the second dielectric material and of the second polysilicon layer that do not form the at least one predetermined structure.

8. A method according to claim 1, wherein an etchant that etches the first dielectric material selectively relative to the second dielectric material is employed for removing the layer of the first dielectric material.

9. A method according to claim 8, wherein the etchant contains hydrogen fluoride.

10. A method according to claim 1, wherein the layer of the first dielectric material contains silicon dioxide.

11. A method according to claim 10, wherein the layer of the second dielectric material contains silicon nitride.

12. A method according to claim 1, wherein the silicide layer contains a silicide selected from a group consisting of titanium silicide, platinum silicide, cobalt silicide and combinations thereof.

13. A method according to claim 1, wherein the at least one uncovered structure is a base contact of an integrated transistor.

14. A method according to claim 1, wherein the integrated semiconductor structure is a transistor.

15. A method according to claim 14, wherein the transistor is a bipolar transistor.

16. A transistor formed by the method of claim 1.

17. A transistor comprising a base region having an emitter region as well as a collector region, said base region having a contact formed in a first polysilicon layer with a portion covered by a first dielectric material, said emitter region having a contact formed in a second polysilicon portion separated from the first polysilicon portion by the first dielectric material and being covered by a second dielectric material, portions of the first dielectric material being free of the second polysilicon layer and the second dielectric material to form exposed portions of the first polysilicon layer, said exposed portions of the first polysilicon layer being covered by a silicide, wherein the portions of the first polysilicon layer covered by the first dielectric material, the second polysilicon layer and the second dielectric material being free of siliconization.

* * * * *